United States Patent [19]

Palara et al.

[11] Patent Number: 5,424,666
[45] Date of Patent: Jun. 13, 1995

[54] CONTROL CIRCUIT FOR SLOWLY TURNING OFF A POWER TRANSISTOR

[75] Inventors: Sergio Palara; Stefano Sueri; Donato Tagliavia, all of Catania, Italy

[73] Assignee: Consorzio Per La Ricera Sulla Microelectronica Nel Mezzogiorno, Catania, Italy

[21] Appl. No.: 233,637

[22] Filed: Apr. 26, 1994

[51] Int. Cl.⁶ .............................................. H03K 3/26
[52] U.S. Cl. ................................... 327/110; 327/131; 327/381; 327/478
[58] Field of Search .............. 327/125, 130, 131, 133, 327/134, 172, 380, 381, 110, 478

[56] References Cited

U.S. PATENT DOCUMENTS 3,829,708  8/1974  Grunleitener et al. ............. 327/110
5,341,032  8/1994  Brambilla et al. .................. 327/110

FOREIGN PATENT DOCUMENTS 0082493  6/1983  European Pat. Off. ...... H03K 17/08
0213635  3/1987  European Pat. Off. ...... H02M 7/538
0350301  1/1990  European Pat. Off. ...... H03K 17/08

OTHER PUBLICATIONS

Sax, H., "Verlustarme Ansteuerung von Aktuatoren," Elektronik, 36(23):142–152, Nov. 13, 1987.

Primary Examiner—Timothy P. Callahan
Assistant Examiner—Jung Ho Kim
Attorney, Agent, or Firm—Seed and Berry

[57] ABSTRACT

A control circuit for slowly turning off a solid-state power transistor, particularly for inductive loads, comprising means for limiting the load current flowing through the switch, and timing and control circuits to ensure, irrespective of the duration of a command pulse, slowed turn-off of the switch with a predetermined delay as to the time when the maximum load current value is reached, thereby keeping the power dissipation through the switch during the load current limiting phase within predetermined values and the turn-off overvoltage within predetermined levels.

6 Claims, 2 Drawing Sheets

5,424,666

CONTROL CIRCUIT FOR SLOWLY TURNING OFF A POWER TRANSISTOR

DESCRIPTION

1. Technical Field

This invention relates to a control circuit for slowly turning off a power transistor which controls an inductive load.

2. Background of the Invention

It is a well-known fact that today's driver circuits for electric loads make ample use of solid state switching power devices, such as bipolar transistors, MOS-technology field-effect power transistors, and the like.

Such devices are preferably operated to either a fully opened or fully closed condition, as against an adjusted condition, in order to minimize the switch power losses which occur primarily during short transients in switching from the open state to the closed state, and vice versa.

The use of such devices for controlling basically inductive loads poses some serious problems which are still without a fully satisfactory solution.

Considering, for example, a bipolar power transistor (of the NPN type) with its emitter grounded (optionally through a low-value resistor for measuring the emitter current) and its collector connected to a positive voltage supply VS through an inductive load L, it may be appreciated that the transistor can be brought to a closed condition from an open one with substantially no switching losses, since the current begins to flow through the load with a null initial value that grows linearly with the load inductance.

Where the load resistance is negligible, very high current levels may be attained over time which may harm both the load and the switch.

The problem is still more serious with inductive loads which incorporate ferromagnetic circuits.

In that case, at certain current levels, the magnetic circuit becomes saturated and the load inductance drops sharply and drastically, resulting in rapid increase of the load current.

To avoid such overload situations, it has long been known that switches intended for controlling inductive loads must be switched on for limited time periods correlated to the load inductance and to the highest allowable current, or as an alternative the switches must be provided with automatically operated load-limiting circuits effective to drive the switch from a state of full conduction to an intermediate control state which holds the load current at a predetermined level.

However, such practices can only partially solve the problem.

In the former case, in fact, the fast switching off produces an overvoltage at the transistor collector which is higher, the faster is the switching off thereby the component may fail or the load malfunction or be harmed undesirably.

In the latter case, that is with a current-limiting circuit and the load current set at a constant maximum level, the reactive effect of the inductor is missed. This means that the inductor will perform as a resistive load, with a voltage drop across the load equal to the current imposed by the limiter multiplied by the internal resistance.

If the internal resistance is low, then the supply voltage will be almost entirely applied to the transistor, which must then dissipate a large amount of power. This condition, while being tolerable for very short time periods, is bound to cause transistor heating and its ultimate destruction with time. Thus, even in this case the transistor turn-off is required and will bring about here the same problems as in the former case.

To avoid the drawbacks which accompany the switch opening, it has been common practice to provide, where the load allows for it, recirculation diodes, Zener diodes in case, in order to dissipate the reactive energy of the inductor or possibly snubbing circuits in parallel with the switch and consisting of capacitive and resistive elements for convening the reactive energy of the inductors to capacitive energy and gradually dissipating it through the resistive element.

In order for such circuits to effectively limit the switching off overvoltage, they require to be appropriately sized and, therefore, that components be used which can withstand large amounts of instant power and temporarily store energy in large amounts.

Accordingly, they are bound to be bulky, expensive and difficult to integrate in control devices. In addition, they are ill-used, because they would only operate on the switch being opened.

SUMMARY OF THE INVENTION

The drawbacks of the prior art are overcome by a slow turn-off control circuit for a power transistor, according to this invention, wherein the reactive energy of an inductive load is dissipated at a controlled overvoltage, within the switch device itself, the latter being opened gradually from a maximum value to a null value within a predetermined time period.

According to another aspect of this invention, the time when the switch begins to open is set by a predetermined maximum load current being reached, using hold circuits which provide for this maximum current to be reached irrespective of the duration of a command pulse being applied to the circuit.

Thus, the current pulse applied to the inductive load is unaffected by the variability of the load inductance and the duration of the command pulse.

According to a further aspect of this invention, the time when the switch begins to open is set a predetermined time after a maximum load current is attained, said current being held throughout the predetermined time such that a controlled power dissipation can take place in the switch and a new switching on is inhibited by the circuit for a longer time than the activation time, thereby providing a switch duty cycle below unity, and hence, a mean dissipated power which is conveniently less than the instant dissipated power.

By such measures, the transistor switch can be made to perform quite independently of the varying durations of the command signals applied thereto, which is obviously advantageous where such commands are issued manually and, therefore, liable to broad variations.

These advantages are achieved by a slowed turn-off control circuit for a power transistor, comprising a current-limiting circuit, a timing ramp generator activated at a predetermined load current, an amplifier preferably of the transconductance kind and being coupled to said ramp generator to apply the limiting circuit an electric signal which varies linearly with said ramp, a circuit for holding the input command signal at an active level while the ramp generator is active, and a reset circuit for said ramp generator.

BRIEF DESCRIPTION OF THE DRAWINGS

The features and advantages of the invention can be more clearly understood from the following description of a preferred embodiment thereof and the accompanying drawings, in which.

DETAILED DESCRIPTION OF THE INVENTION

Figure 1:
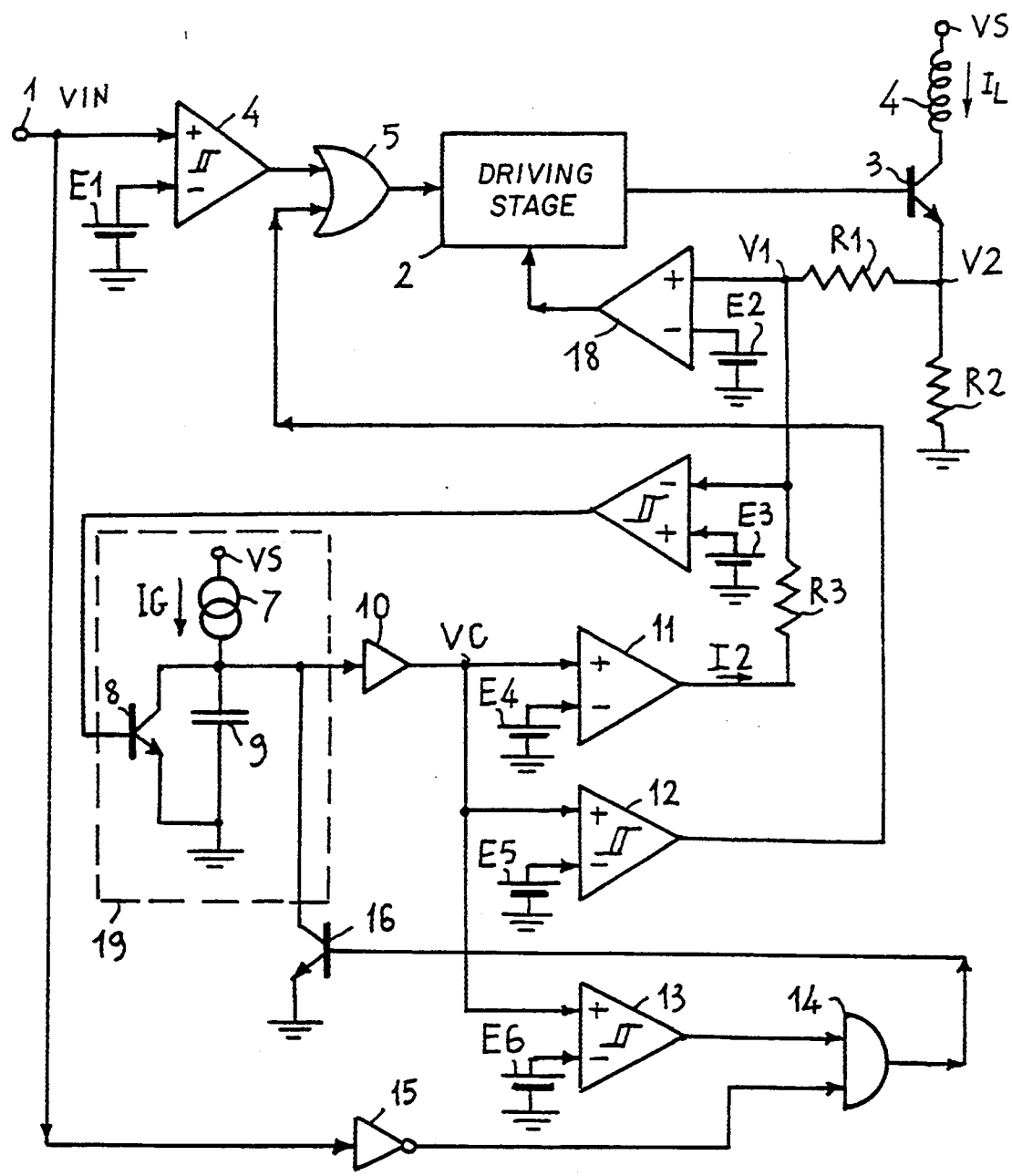
FIG. 1 is a block circuit diagram of a preferred embodiment of a slowed turn-off control circuit according to the invention.

With reference to FIG. 1, the control circuit for a power transistor 3 comprises a conventional driving stage 2, a logic OR input gate 5, an input receiver element 4, preferably of the hysteresis signal comparator type, receiving as input a control signal VIN and a reference voltage E1.

The transistor 3, e.g. of the NPN type, has its collector connected to an inductive load 4 which is supplied from a positive voltage supply VS, and its emitter connected to ground through a measurement resistor R2 having a low resistance on the order of $10^{-2}$ ohms.

The base of the transistor 3 is controlled by the output 17 from the driving stage 2.

The emitter of the transistor 3 is connected, via a resistor R1, to the non-inverting input of an operational amplifier 18 whose inverting input is connected to a reference voltage E2.

The output VR of the amplifier 18 is connected to the driving stage 2 input VR and controls it to limit the emitter current (which, assuming for the moment no significant contribution from the base current, equals the load current IL through the inductor 4) at a maximum value IM such that IM*R2=E2.

The control circuit further comprises a plurality of amplifiers/hysteresis comparators 6, 12, 13, a transconductance amplifier 11, a voltage ramp generating circuit (in turn comprising a constant current IG generator 7, transistor 8, and capacitor 9), a buffer or impedance isolator 10, a signal inverter 15, a logic AND gate 14, and a transistor 16.

The comparator 6 has its inverting input connected to the non-inverting input of the comparator 18 and its non-inverting input connected to a reference voltage E3.

The output of the comparator 6 is connected to the base of the transistor 8, whose collector is supplied from the generator 7 and whose emitter is connected to ground. The capacitor 9 is connected between the collector and the emitter of transistor 8. The collector is also connected to the input of the buffer 10 whose output is connected to the non-inverting input of the amplifier 11 having its inverting input connected to a reference voltage E4.

The amplifier 11 output is connected, via resistor R3, to the non-inverting input of the amplifier 18.

The buffer 10 output is also connected to the non-inverting input of the comparators 12, 13 whose inverting inputs are connected to the reference voltages E5 and E6, respectively.

The comparator 12 output is connected to an input of the OR gate 5, and the comparator 13 output is connected to an input of the AND gate 14.

The AND gate 14 has another input connected to the output of the logic NOT element 15 and its output connected to the base of the transistor 16.

The collector of the transistor 16, having its emitter grounded, is connected to the collector of the transistor 8.

The circuit control signal VIN is applied to an input terminal 1, and thence led to an input of the comparator 4 and the input of NOT 15.

The reference voltages E1, E2, E3, E4, E5 and E6 may be selected to suit applicational demands and need not be different from one another. They define, according to their levels, different operating conditions which can be readily adapted to fit with specific demands, such levels being apparent to those who design circuits of this type.

Figure 2:
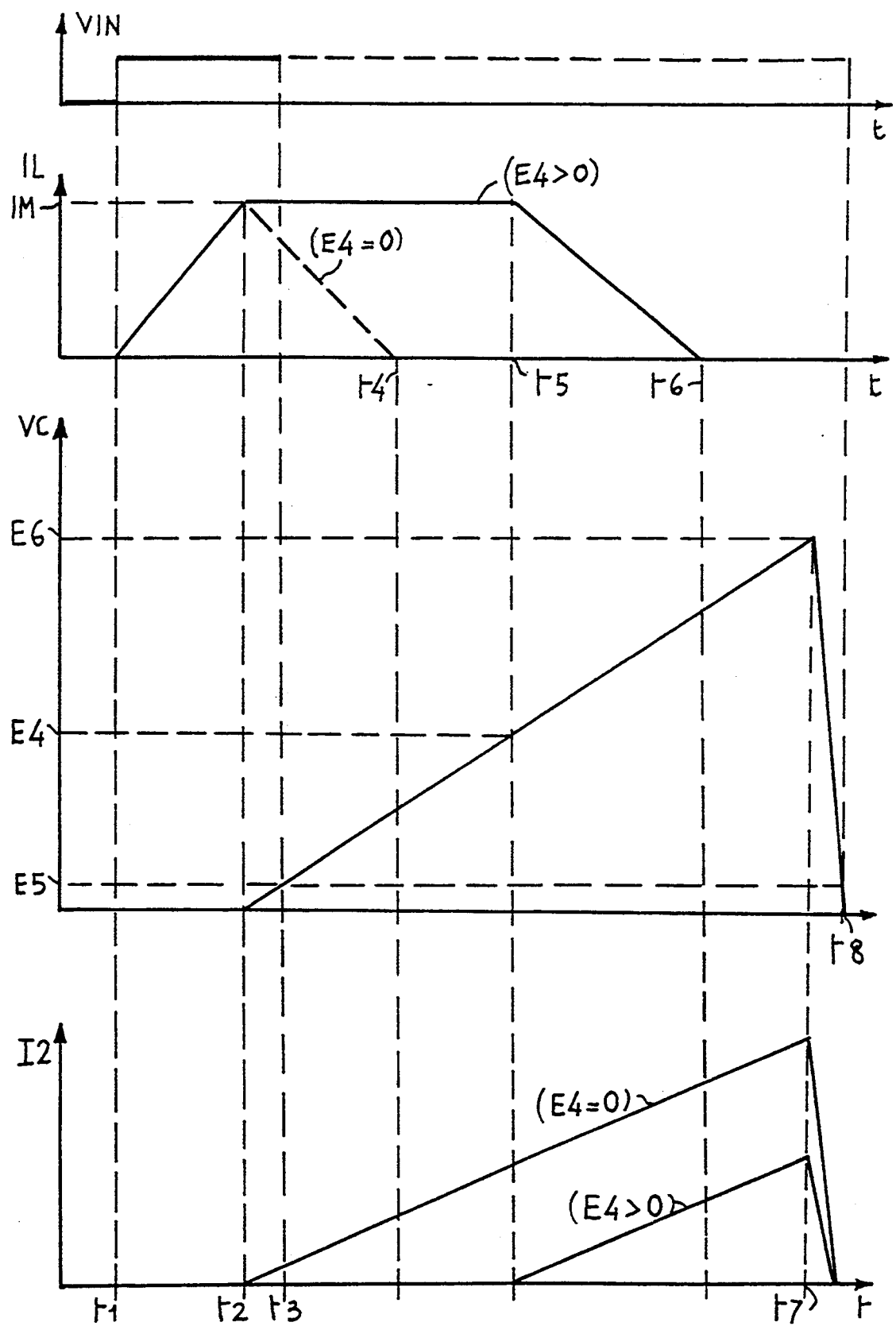
FIG. 2 shows in timing diagram the voltage/current at some locations of the circuit in FIG. 1.

The circuit operation is explained by the time diagrams in FIG. 2 which respectively represent the control signal VIN, load current IL, output voltage VC from the ramp generator, and output current (or voltage) 12 from the amplifier 11.

Shortly after, VIN being activated the OR gate 5 outputs a command signal.

The diagrams show two discrete operating conditions, of which one is related to slowed turn-off driving of the transistor 3 upon a predetermined maximum load current IL=IM being reached.

In this case, the reference voltage E4 may be conveniently put equal to 0 and the reference voltage E3 equal to E2.

The respective diagrams are denoted by the reference E4=0.

The second operating condition provides, once a load current condition of IL=IM is reached, for it to be held by the current limiting circuit for a predetermined time, at the expiry whereof the transistor 3 is slowly turned off irrespective of the duration of the control pulse VIN.

In this case, the reference voltage E4 is conveniently greater than 0.

The corresponding diagrams are denoted by the reference E4>0.

Let us now consider the instance of E4=0 and E3=E2.

Between time T0 and T1, the control signal VIN is at a zero electric and logic level (it is assumed, for example, that a logic level 0 corresponds to an electric level 0, and that a positive electric level corresponds to a logic level 1 ) and the transistor 3 is open.

Since no current is flowing through the load, the voltage V2 at the transistor 3 emitter will be null, and the comparator 6 will apply a positive voltage to the base of the transistor 8 which holds it in conduction.

The capacitor 9 is shortened and the output voltage VC from the buffer 10 is null, as is the current/voltage output from the amplifier 11.

Thus, both the amplifier 11 and the comparators 12, 13 will output a null current/voltage signal.

This electric state defines a rest or inactive condition of the circuit.

At time T1, a positive voltage pulse is applied to the control input 1 and transferred to the stage 2, which sets the transistor 3 to conduct.

The current IL increases, therefore, linearly to cause a voltage drop at R2.

Thus, V2 increases linearly.

At a time T2, the voltage drop at R2 equals the voltage E3, and the amplifier 18 will apply an error signal to the stage 2, limiting the current IL to a maximum value IM.

Concurrently therewith, since it has been assumed that E3=E2, the comparator 6 will toggle thereby bringing its output to 0 and opening the transistor 8.

The capacitor 9 begins to be charged and the voltage VC increases according to a linear law (VC=IG(t−t2)/C).

Since E4=0, the transconductance amplifier 11 will output a current I2=VC * K=IG(t−t2) * K/C, where K is a transconductance.

Since the input impedance of the amplifiers 6, 18 may be rendered negligible, the current I2 flowing through R1 and R2 tends to raise the input voltage to the amplifier 18, which by acting on the stage 2, will force the current IL to decrease such that R1*I2+R2*IL is equal to E2.

Accordingly, IL decreases linearly as I2 increases.

Understandably, the voltage drop across R2 due to the component I2 is negligible compared to the drop IL*R2.

In this example (E4=0), the transconductance amplifier 11 may, in its simplest form, be an emitter-follower transistor arrangement with the emitter resistance provided by the series resistors R1, R3.

In order to prevent the removal of the command signal VIN from causing the transistor 3 to open during the turn-off phase, the comparator 12 will be applying, upon the voltage VC exceeding the voltage E5 (in this case, conveniently selected to have a value close to 0 and indicated at E5 on the graph VC), a positive-level hold signal to the stage 2, through the gate 5, from a time T3 very close to T2.

At a time T4, the transistor 3 will be off completely, but cannot be switched on again while the control circuit is active.

The control circuit is reset by the comparator 13.

Upon the ramp voltage VC becoming equal to the reference voltage E6 (at time T7), the positive level will appear at the comparator 13 output, and through the AND gate 14 if no control signals appear at the input 1, the comparator 13 will close the transistor 16, discharging the capacitor 9, which operation is soon completed at a time T8 immediately following T7.

By selecting E6 conveniently high and a suitably low ramp gradient, it becomes possible to prevent re-activation of the transistor 3 for a predetermined time, and accordingly, provide a duty cycle which is consistent with the transistor function.

The circuit operation where E4>0 is quite similar.

In this case, the current ramp in the transistor 3, from time T1 to T2, follows a supply condition (period T2, T5) where the current is held at the value IM by the limiter 18.

At time T5, when the voltage VC equals the reference voltage E4, the amplifier 11 begin to conduct (graph I2 with E4>0) and the transistor 3 is gradually turned off.

It may be appreciated that the circuit described does provide the transistor 3 with effective protection against turn-off overvoltages, which are limited, and at the same time against excessive power dissipations through the transistor 3 as may originate from improper activation commands or noise.

It is understood that the foregoing description only covers a preferred embodiment and that many changes may be made thereunto without departing from the invention scope.

In particular, the transistors 3, 8, 16 could be MOSFET devices instead of NPN-type transistors as shown.

The generator 7 may be replaced with a resistor, and the function of the transistor 16 may be performed by the transistor 8, in this case under control by the input 1 and the output of the comparator 13 through suitable logic circuitry (basically an OR receiving as input the outputs from the comparator 6 and the AND gate 14).

Also the resistor R3 may be omitted in the instance of a transconductance amplifier 11, it only being required where the amplifier 11 is a voltage amplifier having a low output impedance.

Figure 3:
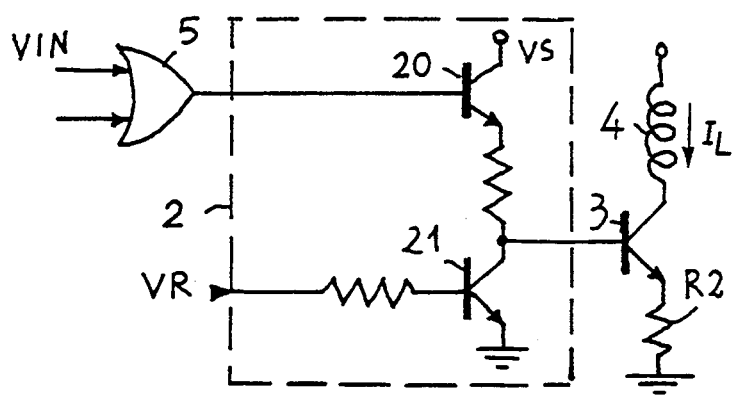
FIG. 3 shows by way of example a circuit diagram of a transistor driving stage for the circuit of FIG. 1.

FIG. 3 shows diagramatically, for the illustrative purposes, one suitable driver stage 2 for the transistor 3.

The stage 2 basically comprises two transistors 20, 21, wherein the former has its collector connected, to the positive voltage source VS and its emitter connected to the base of transistor 3 (or of a transistor pair in a Darlington configuration).

The transistor 21 has its collector connected to the base of transistor 3 and its emitter connected to ground.

The base of the transistor 20 is controlled by the input signal VIN as applied through the gate 5.

The base of the transistor 21 receives as input the error and adjustment signal VR output by the amplifier 18.

When the load current tends to exceed the maximum current IM, the transistor 21 is caused to conduct and partly draw the base current imposed on the transistor 3 by transistor 20, to discharge it to ground.

It will appear that with this circuit, in order to ensure slowed turn-off for the transistor 3, the transistor 20 must be held in conduction throughout the time period required to turn it off.

For this reason, the control circuit described provides, through the comparator 12 and the gate 5, for the block 2 to be held in an active state even absent the command pulse.

It will be noticed that this holding is only ensured from the time T3, following the time T2 whereupon the ramp generator is activated.

However, the ramp generator could be activated at a time immediately after T1 by selecting the reference voltage E3 very close to 0, if desired in a particular implementation.

It may also be appreciated that the circuit of FIG. 3 is partly illustrative only, and that its preferred construction would be largely dictated by the type of the solid state switch to be controlled. Many other driver circuits for the stage 2 may be used and a circuit using such a suitable driver circuit thus falls within the scope of this invention.

We claim:

1. A control circuit for slowly turning off a solid state power switch upon a control signal being activated comprising:
   a command signal circuit that generates a command signal upon the control signal being activated;
   a driver stage activated by the command signal;
   a detector means for detecting a load current flowing through said switch;
   a load current limiting circuit connected to said detector means;
   a timing circuit generating a first electric ramp signal activated by the load current above a predetermined value;
   a first amplifier receiving, on a first input node thereof, said first electric ramp signal, and on a second input node, a predetermined electric reference signal, to generate a second electric ramp signal which varies linearly with said first signal, said second signal being input to said limiting circuit; and a first circuit means activated by said first ramp signal at a predetermined level, to reset said timing circuit to an inactive state.

2. A circuit as in claim 1, wherein said second ramp signal is input to said timing circuit.

3. A circuit as in claim 1, comprising a second, hold circuit means activated by said timing circuit to maintain said command signal or its current date to said driving stage upon the value of said first ramp signal exceeding a predetermined level.

4. A circuit as in claim 1, wherein said limiting circuit comprises a second amplifier having a first input node connected, through a resistor, to said load current detecting means, said second electric ramp signal being applied to said first input node, and a second input node of said amplifier receiving a predetermined reference voltage.

5. A circuit as in claim 1, wherein said first amplifier is a transconductance amplifier having a first input node for receiving said first electric ramp signal and a second input node for receiving said predetermined electric reference signal having a predetermined level.

6. A circuit as in claim 1, wherein said first circuit means comprises a comparator having a first input node for receiving said first electric ramp signal and a second input node for receiving a reference voltage having a predetermined level, and logic circuits for resetting said timing circuit and receiving as input said control signal and art output signal from said comparator to set said timing circuit to an inactive state upon an output signal from said comparator exceeding a predetermined level and absence said control input signal.

* * * * *

UNITED STATES PATENT AND TRADEMARK OFFICE
CERTIFICATE OF CORRECTION

PATENT NO. : 5,424,666
DATED : June 13, 1995
INVENTOR(S) : Sergio Palara, et. al.

It is certified that error appears in the above-indentified patent and that said Letters Patent is hereby corrected as shown below:

Title page, item [73], Assignee, delete "La Ricera" an dinsert therefor--La Ricerca--.

Title page, item [73], Assignee, delete "microelectronica" and insert--Microelecttronica--.

Column 7, line 13, delete "or" and insert--in--

Column 7, line 13, delete "date" and insert --state--.

Column 8, line 15, delete "art" and insert --an--.

Signed and Sealed this

Fourteenth Day of January, 1997

Attest:

BRUCE LEHMAN

*Attesting Officer*  *Commissioner of Patents and Trademarks*